(12) United States Patent
Hoeppel et al.

(10) Patent No.: US 10,236,419 B2
(45) Date of Patent: Mar. 19, 2019

(54) COMPONENT AND METOD FOR PRODUCING A COMPONENT

(71) Applicant: OSRAM Opto Semiconductors GmbH, Regensburg (DE)

(72) Inventors: Lutz Hoeppel, Alteglofsheim (DE); Korbinian Perzlmaier, Regensburg (DE); Christine Rafael, Donaustauf (DE); Anna Kasprzak-Zablocka, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/758,186

(22) PCT Filed: Oct. 6, 2016

(86) PCT No.: PCT/EP2016/073883
§ 371 (c)(1),
(2) Date: Mar. 7, 2018

(87) PCT Pub. No.: WO2017/060355
PCT Pub. Date: Apr. 13, 2017

(65) Prior Publication Data
US 2018/0248083 A1    Aug. 30, 2018

(30) Foreign Application Priority Data
Oct. 8, 2015  (DE) .......................... 10 2015 117 198

(51) Int. Cl.
*H01L 33/48*  (2010.01)
*H01L 33/60*  (2010.01)
(Continued)

(52) U.S. Cl.
CPC .......... *H01L 33/486* (2013.01); *H01L 33/382* (2013.01); *H01L 33/54* (2013.01);
(Continued)

(58) Field of Classification Search
None
See application file for complete search history.

(56) References Cited

U.S. PATENT DOCUMENTS

| 2009/0065800 A1* | 3/2009 | Wirth | .............. H01L 31/022408 257/100 |
| 2011/0114986 A1* | 5/2011 | Kojima | .................. H01L 33/405 257/99 |

(Continued)

FOREIGN PATENT DOCUMENTS

| DE | 102010025320 A1 | 12/2011 |
| DE | 102013110853 A1 | 4/2015 |

(Continued)

*Primary Examiner* — Marcos D. Pizarro
*Assistant Examiner* — Lawrence C Tynes, Jr.
(74) *Attorney, Agent, or Firm* — Slater Matsil, LLP (57) ABSTRACT

A component includes a semiconductor body, a carrier, and a stabilization layer arranged between the semiconductor body and the carrier in the vertical direction. The semiconductor body has a first semiconductor layer facing away from the carrier, a second semiconductor layer facing the carrier, and an active layer arranged between the first semiconductor layer and the second semiconductor layer. The carrier has a first via and a second via laterally spaced apart from the first via by means of an intermediate region. The first via is connected to the first semiconductor layer in an electrically conductive manner and the second via is connected to the second semiconductor layer in an electrically conductive manner. The stabilization layer is continuous, overlaps with the vias in a top view, and laterally bridges the intermediate region. The stabilization layer is electrically insulated from the vias and from the semiconductor body.

20 Claims, 6 Drawing Sheets

(51) Int. Cl.
*H01L 33/62* (2010.01)
*H01L 33/38* (2010.01)
*H01L 33/54* (2010.01)

(52) U.S. Cl.
CPC .............. *H01L 33/60* (2013.01); *H01L 33/62* (2013.01); *H01L 2933/005* (2013.01); *H01L 2933/0033* (2013.01); *H01L 2933/0058* (2013.01); *H01L 2933/0066* (2013.01)

(56) References Cited

U.S. PATENT DOCUMENTS

| 2012/0227493 | A1* | 9/2012 | Vandebeuque | B23K 1/0016 |
| | | | | 73/504.18 |
| 2013/0187192 | A1* | 7/2013 | Hoeppel | H01L 31/02005 |
| | | | | 257/99 |
| 2014/0001502 | A1* | 1/2014 | Akimoto | H01L 33/387 |
| | | | | 257/98 |
| 2014/0231845 | A1 | 8/2014 | Akimoto et al. | |
| 2016/0218097 | A1 | 7/2016 | Plössl et al. | |
| 2017/0330981 | A1 | 11/2017 | Hoeppel et al. | |

FOREIGN PATENT DOCUMENTS

| DE | 102014116935 | A1 | 5/2016 |
| DE | 102015100578 | A1 | 7/2016 |
| DE | 102015105509 | A1 | 10/2016 |
| EP | 2325905 | A2 | 5/2011 |
| EP | 2680326 | A2 | 1/2014 |

* cited by examiner

COMPONENT AND METOD FOR PRODUCING A COMPONENT

CROSS-REFERENCE TO RELATED APPLICATIONS

This application is a national phase application under 35 USC 371 that claims the benefit of PCT/EP2016/073883, filed Oct. 6, 2016, which claims the priority of German patent application 10 2015 117 198.8, filed Oct. 8, 2015, each of which is incorporated herein by reference.

TECHNICAL FIELD

A component and a method for producing a component are provided.

SUMMARY

Embodiments of the invention provide a component having high mechanical stability that can be produced in a simplified manner. Further embodiments provide a cost-effective method for producing such a component.

According to at least one embodiment, a component has a semiconductor body comprising an active layer. In particular, the active layer is a pn-junction zone. The active layer can be formed as one layer or as a layer sequence of a plurality of layers. For example, during operation of the component, the active layer emits electromagnetic radiation, for example, in the visible, ultraviolet or infrared spectral range. Alternatively, during operation of the component, the active layer can absorb electromagnetic radiation and convert it into electrical signals or electrical energy. The component is formed in particular as an optoelectronic component.

Furthermore, the semiconductor body can comprise a first semiconductor layer of a first charge carrier type and a second semiconductor layer of a second charge carrier type, wherein the active layer is arranged in particular between the first semiconductor layer and the second semiconductor layer. Preferably, the semiconductor body comprises only semiconductor layers. The layers of the semiconductor body can be applied to a growth substrate in layers by means of an epitaxy method. The growth substrate can subsequently be thinned or removed from the semiconductor body, so that the component is in particular free of a growth substrate.

The semiconductor body has a first main surface, which is preferably formed as a radiation passage area of the component. The radiation passage area can be structured, as a result of which a radiation outcoupling efficiency or a radiation coupling efficiency is increased. In particular, the first main surface of the semiconductor body is formed by a surface of the first semiconductor layer. The semiconductor body has a second main surface facing away from the first main surface, which is formed, for example, by a surface of the second semiconductor layer. In particular, the first main surface and the second main surface delimit the semiconductor body in the vertical direction.

A vertical direction is understood to mean a direction which is transverse, in particular perpendicular to a main extension area of the active layer. For example, the vertical direction is perpendicular to the first main surface and/or to the second main surface of the semiconductor body. A lateral direction, on the other hand, is understood to mean a direction which runs along, in particular parallel to the main extension area of the active layer. In particular, the vertical direction and the lateral direction are directed perpendicular to one another.

According to at least one embodiment of the component, the semiconductor body has at least one recess. The recess extends in particular from the second main surface through the second semiconductor layer and the active layer into the first semiconductor layer. A recess is understood to mean an opening of the semiconductor body which, in particular, is not formed throughout the semiconductor body. The recess is, for example, completely surrounded by the semiconductor body in lateral directions. The semiconductor body can have a plurality of such recesses. For electrically connecting the first semiconductor layer from the sides of the second main surface, the recess can be filled with an electrically conductive material for forming a through-via. The component can have a plurality of such through-vias.

According to at least one embodiment of the component, the component has a carrier on which the semiconductor body is arranged. The carrier comprises, for example, a first through-contact and a second through-contact. The first through-contact is laterally spaced apart from the second through-contact for instance by an intermediate region. The carrier can have a mold body which is formed, for example, from an electrically insulating molding material. In particular, the mold body is formed contiguously, preferably in one piece. The first through-contact and/or the second through-contact can be embedded at least in regions in the mold body. Along the vertical direction, the through-contacts extend for instance throughout the mold body. The carrier has a front side and a rear side, wherein the front side and/or the rear side are/is formed in particular in regions by surfaces of the mold body. The front side and/or the rear side of the carrier can be formed in regions by surfaces of the through-contacts. In particular, the through-contacts are electrically connectable both on the front side and on the rear side of the carrier. Preferably, the through-contacts are freely accessible both on the front side and on the rear side of the carrier.

According to at least one embodiment of the component, the component has a stabilization layer. The stabilization layer is formed for instance contiguously. Preferably, the stabilization layer is arranged in the vertical direction between the semiconductor body and the carrier. In a plan view, the stabilization layer can have overlaps with the through-contacts. Preferably, the intermediate region is bridged by the stabilization layer along the lateral direction. It is also possible for the stabilization layer to completely cover the intermediate region. The stabilization layer can be formed from an electrically conductive material, for example from a metal. The component is preferably configured in such a way that the stabilization layer is electrically isolated from the through-contacts and/or from the semiconductor body.

In at least one embodiment of the component, the component has a semiconductor body, a carrier and a stabilization layer arranged in the vertical direction between the semiconductor body and the carrier. The semiconductor body comprises a first semiconductor layer facing away from the carrier, a second semiconductor layer facing towards the carrier and an active layer arranged between the first semiconductor layer and the second semiconductor layer. The carrier comprises a first through-contact and a second through-contact which is laterally spaced apart from the first through-contact by an intermediate region. The first through-contact is electrically conductively connected for instance to the first semiconductor layer. The second through-contact is electrically conductively connected for instance to the second semiconductor layer. The stabilization layer is formed in a contiguous manner. In a plan view of the carrier, the stabilization layer has overlaps with the through-contacts and, along the lateral direction, bridges the intermediate region. The stabilization layer is electrically isolated from the through-contacts as well as from the semiconductor body.

Lateral bridging of the intermediate region means that, along at least one lateral direction, the first through-contact and the second through-contact are bridged by the stabilization layer at locations of the intermediate region. In a plan view, the intermediate region can be partially or completely covered by the stabilization layer. The lateral bridging or overlapping of the intermediate region by the stabilization layer has a mechanically stabilizing effect on the component, since possible mechanical weaknesses, in particular at locations of the intermediate region, can be largely or completely prevented. If the stabilization layer is electrically isolated from the through-contacts and from the semiconductor body, the stabilization layer can be exposed in regions without running the risk of a possible electrical short circuit on side surfaces of the component. Such partial exposure of the stabilization layer at the side surfaces of the component often goes back to a singulation process, in which for instance a common stabilization layer is separated into a plurality of stabilization layers of various components. Since the respective stabilization layer does not contribute to the electrical contacting of the component, the risk of having a possible electrical short circuit can be reduced for instance in view of a solder creeping up on the side surfaces of the component.

According to at least one embodiment of the component, the stabilization layer is a self-supporting layer of the component. In other words, the stabilization layer can be formed as an independent layer which is mechanically stable with respect to its own weight without requiring mechanical support of any further layers. For example, along the vertical direction, the stabilization layer has a layer thickness between 5 μm and 50 μm, inclusive, for example between 5 μm and 30 μm, for instance between 5 μm and 15 μm, inclusive. Preferably, the layer thickness of the stabilization layer is at least 10 μm.

According to at least one embodiment of the component, the stabilization layer has at least one opening, through which the first through-contact or the second through-contact extends for electrically contacting the semiconductor body. For example, the stabilization layer has a first opening, through which the first through-contact extends for electrically contacting the semiconductor body. The stabilization layer can have a second opening, through which the second through-contact extends for electrically contacting the semiconductor body. The component can have an insulating structure which electrically isolates the stabilization layer from the through-contacts.

According to at least one embodiment of the component, the stabilization layer and the through-contacts together cover at least 90%, preferably at least 95% of a total area of the active layer. It is also possible for the stabilization layer and the through-contacts together to completely cover the entire active layer and/or the entire semiconductor body. In a plan view of the carrier, the semiconductor body can be mechanically supported continuously by at least one metal layer, for example by the stabilization layer and/or by the through-contacts, as a result of which a particularly high mechanical stability of the entire component is achieved.

According to at least one embodiment of the component, the carrier has a mold body made of an electrically insulating material. The through-contacts are preferably embedded at least in regions in the mold body. In lateral directions, the through-contacts can be completely enclosed by the mold body. In the vertical direction, the through-contacts can extend through the mold body. The mold body can be formed in such a way that the semiconductor body is enclosed by the mold body in regions in the lateral directions. In other words, sideways of the semiconductor body, the mold body can extend along the vertical direction to such an extent that the mold body laterally encloses, for example, the second semiconductor layer and/or the active layer and/or the first semiconductor layer.

The mold body is preferably formed as a casted body. For example, the mold body is produced by a casting method. In particular, the mold body material is a castable plastic, for example a polymer such as resin, epoxide or silicone. The semiconductor body can be casted by the mold body material of the mold body in regions. A casting method is understood to mean in general a method by which, preferably under the influence of pressure, a molding compound can be formed according to a predefined shape and, if necessary, cured. In particular, the term "casting method" includes molding, film-assisted molding, injection molding, transfer molding and compression molding.

According to at least one embodiment of the component, the component has at least one through-via. The through-via extends, for example, from the second main surface of the semiconductor body throughout the second semiconductor layer and the active layer into the first semiconductor layer. For electrically contacting the first semiconductor layer, the through-via can be electrically conductively connected to one of the through-contacts of the carrier. In order to achieve a uniform current distribution within the first semiconductor layer, the component can have a plurality of such through-vias. The through-via is electrically insulated, for example, from the second semiconductor layer and/or from the active layer by the insulating structure of the component. In this case, the insulating structure of the component can extend into the semiconductor body in regions. In the lateral directions, the through-via can be fully enclosed by the insulating structure.

According to at least one embodiment of the component, the component has a mirror layer. The mirror layer is preferably formed to be electrically conductive. In this case, the mirror layer can be electrically conductively connected to one of the through-contacts or to a plurality of the through-contacts of the same electrical polarity. In the vertical direction, the mirror layer is arranged in particular between the semiconductor body and the carrier. The mirror layer can be electrically conductively connected to the through-via or to the through-vias directly or indirectly.

The mirror layer is preferably formed in such a way that it is located exclusively within the component. This means that for example at all side surfaces of the component the mirror layer is covered and is thus inaccessible. In other words, all side surfaces of the component are preferably void of the mirror layer. In the lateral direction, the mirror layer can be completely covered by the insulating structure of the component. Along the vertical direction and sideways of the second semiconductor layer, the mirror layer can extend as far as to laterally cover or laterally surround the second semiconductor layer and/or the active layer at least in regions. Electromagnetic radiation escaping laterally or backwards from the semiconductor body can thus be reflected back in the direction of the active layer or in the direction of the radiation passage area of the component, as a result of which the efficiency of the component is enhanced. The mirror layer can be formed as one metal layer or as a stack of metal layers.

According to at least one embodiment of the component, the stabilization layer is freely accessible on at least one side surface of the component. The stabilization layer can be freely accessible on all side surfaces of the component. In particular, the stabilization layer has singulation traces on at least one side surface or on all side surfaces of the component. Alternatively, it is also possible for the stabilization layer to be fully enclosed for instance by the insulating structure.

According to at least one embodiment of the component, the component is formed in such a way that the side surfaces of the component are void of electrically conductive layers, which are electrically conductively connected to the semiconductor body and/or to at least one of the through-contacts, or preferably are neither electrically conductively connected to the semiconductor body nor to any through-contact. Due to such a construction of the component it can be avoided that an electrically conductive connecting material creeping up on the side surfaces of the component causes an electrical short circuit.

In at least one embodiment of a method for producing one or a plurality of components, which are described here for instance, the carrier is formed step by step on the semiconductor body. In other words, the carrier of the component is not formed separately for instance from its associated carrier of the component, but is formed rather directly on the associated semiconductor body, that is to say in the presence of the associated semiconductor body. In the production of a plurality of such components, the through-contacts of different components are formed in particular by a common method step. For example, the through-contacts are applied to the semiconductor body by a coating method, preferably by a galvanic coating method. Also the stabilization layer can be applied to the semiconductor body by a galvanic coating method.

According to at least one embodiment of a method for producing a plurality of components, a wafer composite is provided. The wafer composite can comprise a semiconductor body composite, a plurality of first through-contacts, a plurality of second through-contacts and at least one or a plurality of contiguous stabilization layers. The wafer composite can comprise a plurality of separating trenches, through which the semiconductor body composite is severable into a plurality of semiconductor bodies. In this case, in the presence of the separating trenches, the semiconductor bodies can still have a common semiconductor layer, for instance the first semiconductor layer. Here, the separating trenches can be formed in the wafer composite in such a way that they extend through the second semiconductor layer and the active layer into the first semiconductor layer. Subsequently, in a roughening step for forming a structured radiation passage area, the common semiconductor layer can be removed in regions in such a way that the semiconductor bodies are completely separated from one another. Alternatively, it is also possible for the separating trenches to be formed in such a way that along the vertical direction they extend through the entire semiconductor body composite such that, already during the formation of the separating trenches, the semiconductor bodies are completely separated from each other.

For forming a mold body composite a mold body material is applied to the wafer composite for instance in such a way that the separating trenches and intermediate regions between the through-contacts are filled at least partially or completely. In a subsequent method step, the wafer composite and the mold body composite are singulated for instance along the separating trenches into a plurality of components in such a manner that the components each have one of the semiconductor bodies, one stabilization layer and one carrier, wherein the carrier comprises a first through-contact, a second through-contact and a mold body as part of the mold body composite.

The method described above is particularly suitable for the production of one or a plurality of the components described here. Features described in connection with the component can therefore also be used for the method and vice versa.

BRIEF DESCRIPTION OF THE DRAWINGS

Further advantages, preferred embodiments and further developments of the method as well as of the component will become apparent from the exemplary embodiments explained below in conjunction with FIGS. 1A to 3B.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

Figure 1A:
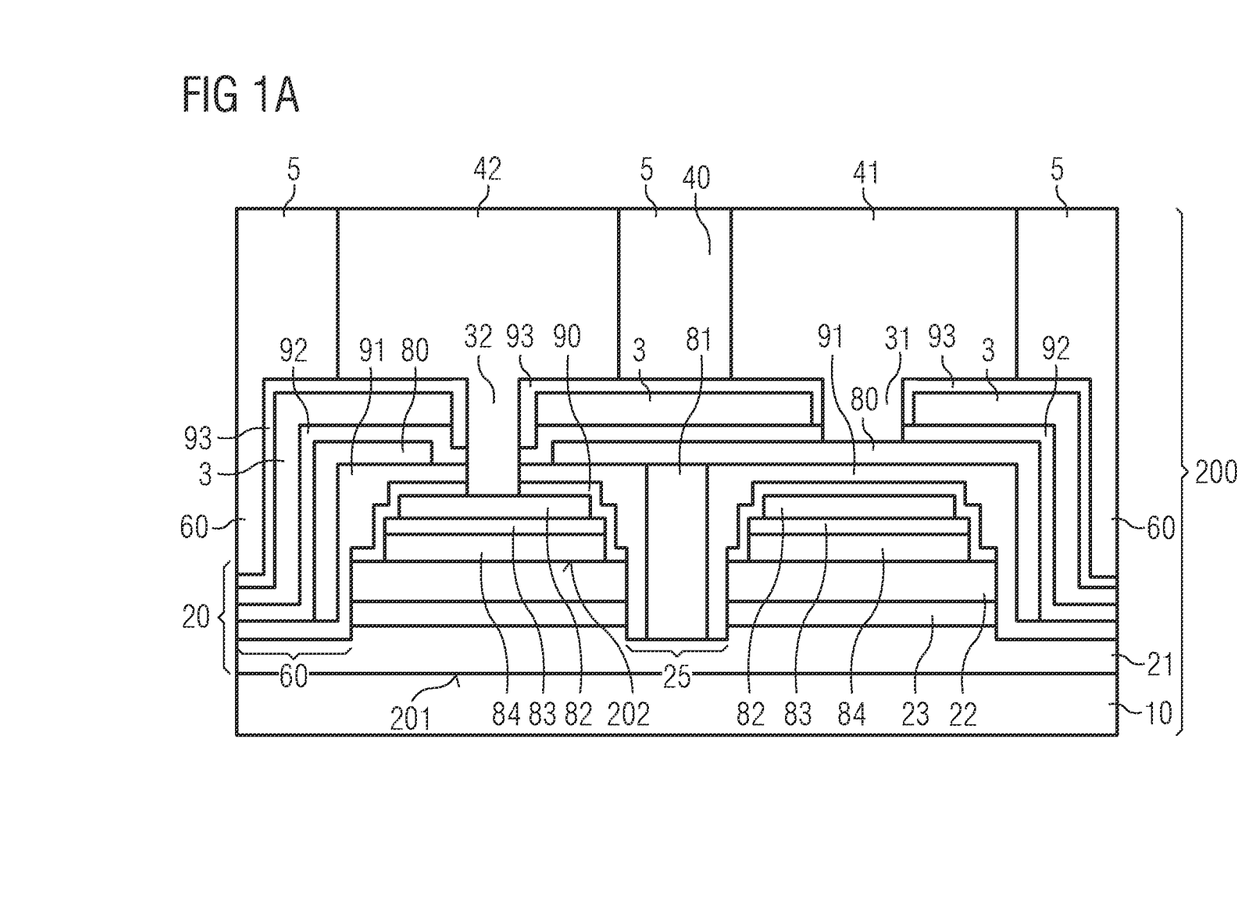
FIGS. 1A and 1B show a wafer composite or a component in schematic sectional views.

FIG. 1A shows a composite 200, in particular a wafer composite 200. The composite 200 has a semiconductor body composite 20. The semiconductor body composite 20 is arranged on a substrate 10. The substrate 10 is in particular a growth substrate, for example a sapphire substrate, wherein the semiconductor body composite 20 can be deposited on the growth substrate in layers, for instance by an epitaxy method. The semiconductor body composite 20 has a first main surface 201 facing towards the substrate 10 and a second main surface 202 facing away from the substrate 10. In particular, the first main surface 201 is formed by a surface of a first semiconductor layer 21, for instance of an n-conducting gallium nitride layer, and the second main surface 202 is formed by a second semiconductor layer 22, for instance of a p-conducting gallium nitride layer, of the semiconductor body composite 20. The semiconductor body composite 20 has an active layer 23 which is arranged between the first semiconductor layer 21 and the second semiconductor layer 22. In particular, the active layer 23 is a pn-junction zone. During operation of the component to be produced, the active layer is configured preferably for detecting or emitting electromagnetic radiation, for example in the visible, ultraviolet or infrared spectral range.

A connection layer 84 is applied to the semiconductor body composite 20. Preferably, the connection layer 84 is formed from a material which is electrically highly conductive and at the same time highly reflective. For example, the connection layer 84 is an electrically conductive mirror layer. For instance, the connection layer 84 is a silver layer. The connection layer 84 is applied to the second semiconductor layer, for example, by a coating method, in particular by evaporation. An electrically conductive protective layer 83 can be formed on the connection layer 84. In particular, the protective layer 83 has a smaller layer thickness than the connection layer 84.

The connection layer 84 and the protective layer 83 can be formed on the semiconductor body composite 20 in a widespread manner and are structured subsequently, for instance partially removed. In particular, the connection layer 84 and/or the protective layer can be structured in such a way that they have common recesses. The semiconductor body composite 20 can be partially exposed in the recesses. The connection layer 84 and the protective layer 83 can be etched in this case. For example, for forming an etching mask, lacquers, in particular photo-structurable lacquers, can be used. Alternatively, it is also conceivable for the connection layer 84 and/or the protective layer 83 to be applied onto the semiconductor body composite 20 in a structured manner, for instance using photo-structurable materials.

A current spreading layer 82 is applied to the structured connection layer 84 and/or protective layer 83. The current spreading layer 82 is applied to the connection layer 84 and/or the protective layer 83 in particular by using photo-structurable lacquers. In this case, the current spreading layer 82 can be formed by a coating method, for example by vapor deposition. The current spreading layer 82 can be formed as a layer stack composed of a plurality of metal layers. In particular, the current spreading layer 82 can comprise metals such as platinum, gold and/or titanium. If the current spreading layer 82 is formed on the protective layer 83 from a zinc oxide layer, the current spreading layer 82 can be void of titanium and/or void of platinum. However, the current spreading layer 82 can also be optional. In this case, the connection layer 84 is preferably a silver layer having a layer thickness of at least 140 nm or of at least 200 nm, for example of approximately 300 nm. The protective layer 83 is preferably a zinc oxide layer having a lower layer thickness than the connection layer 84.

A passivation layer 90 is formed on the semiconductor body composite 20 for instance by a coating method, such as chemical vapor deposition (CVD). In this case, the passivation layer 90 can partially or preferably completely cover the semiconductor body composite 20, the connection layer 84, the protective layer 83 and/or the current spreading layer 82. By chemical, in particular plasma-assisted vapor deposition, the passivation layer 90 can be applied to structured layers, such as the connection layer 84, protective layer 83 and/or current spreading layer 82, in a simplified manner. The passivation layer 90 can comprise an $SiO_2$ layer and/or a silicon nitride layer.

Recesses are formed in the semiconductor body composite 20, for instance by an etching method. Preferably, an RIE-process (reactive ion etching), for instance using chlorine as an etching agent, is used. The recesses 25 and separating trenches 60 can be formed. The recess 25 or the plurality of recesses 25 extends/extend for instance from the second main surface 202 of the semiconductor body composite 20 through the second semiconductor layer 22 and the active layer 23 into the first semiconductor layer 21. The separating trenches 60 can be formed for instance as deep as the recesses 25. Alternatively, it is also possible for the entire separating trenches 60 to be formed through the entire semiconductor body composite 20 along the vertical direction. As a result of the formation of the separating trenches 60, the semiconductor body composite 20 can be divided into a plurality of semiconductor bodies 2. By forming the recesses 25 and/or the separating trenches 60 the passivation layer 90 is removed in places. For electrically isolating the semiconductor body 2 or the semiconductor bodies 2, a first insulation layer 91 is applied to the passivation layer 90 and to the recesses 25 and to the separating trenches 60.

The first insulation layer 91 can be partially removed in the region of the recess 25 or of the recesses 25. By partially removing the first insulation layer 91, the first semiconductor layer 21, for example, is exposed in regions. The first insulation layer 91 can be partially removed by an RIE process preferably using fluorine as an etching agent and lacquers. For electrically contacting the first semiconductor layer 21, the recess 25 or the plurality of recesses 25 is/are filled with an electrically conductive material, for instance with a metal such as silver, as a result of which a through-via 81 is formed. In particular, the through-via 81 is in direct electrical contact with the first semiconductor layer 21. For electrically isolating the through-via 81 from the active layer 23 and from the second semiconductor layer 22, in lateral directions, the through-via 81 is surrounded completely and over its full circumference by the first insulation layer 91.

A mirror layer 80 is formed on the semiconductor body composite 20. The mirror layer 80 is formed in particular after the formation of the through-via 81. Preferably, the mirror layer 80 is electrically conductive and is electrically conductively connected for instance to the through-via 81. The mirror layer 80 and the through-via 81 can comprise the same material, for example silver. The mirror layer 80 can also be formed as a layer stack composed of a plurality of metals or of a plurality of metal layers. In particular, the mirror layer 80 comprises metals such as titanium, silver and/or platinum.

The mirror layer 80 can be formed in such a way that it has an opening in the region of the connection layer 84 and/or of the current spreading layer 82, for example directly above the connection layer 84 or the current spreading layer 82, wherein a bottom surface of the opening is formed by a surface of the first insulation layer 91. The mirror layer 80 can also be formed in such a way that it extends along the vertical direction as far as the bottom surface of the separating trenches 60 and, in doing so, covers the side walls of the separating trenches 60 in particular completely. The separating trenches 60 can, however, have a bottom surface which is void of the mirror layer at least in regions. If applicable, during separation of the composite 200, the mirror layer 80 does not have to be severed.

A second insulation layer 92 is formed on the mirror layer 80. The second insulation layer 92 can be formed analogously to the formation of the first insulation layer by vapor deposition. The first and the second insulation layers can be made of an electrically insulating material such as silicon oxide and/or silicon nitride. In particular, the second insulation layer 92 is formed in such a way that, in a plan view, it covers the semiconductor body composite 20 and/or the separating trenches 60 completely. Preferably, the mirror layer 80 is laterally completely enclosed by the first insulation layer 91 and by the second insulation layer 92.

A stabilization layer 3 is formed on the semiconductor body composite 20. The stabilization layer 3 can be applied to the second insulation layer 92 by a galvanic coating method. For example, a seed layer, for instance made of titanium and/or gold, is applied onto the second insulation layer 92 by sputtering. Using lacquers the stabilization layer 3 can be applied to the second insulation layer 92 in a structured manner.

After formation of the stabilization layer 3, the latter can have at least one first opening 31 and at least one second opening 32. In FIG. 1A, the second opening 32 of the stabilization layer 3 is located in the region of the opening of the mirror layer 80. Within the first opening 31, the mirror layer 80 is exposed in regions. The stabilization layer 3 can also have a plurality of such first openings 31 and a plurality of such second openings 32. The stabilization layer 3 extends along the vertical direction into the separating trenches 60. In this case, the stabilization layer 3 can cover the bottom surfaces of the separating trenches 60 partially or completely. In particular, the stabilization layer 3 of a component 100 to be produced is formed to be contiguous. Preferably, the stabilization layer 3 covers the bottom surfaces of the separating trenches 60 only in places, so that the stabilization layer 3 is not severed for instance during singulation of the semiconductor body composite 20 or of the composite 200 or of the wafer composite 200 into a plurality of components.

The stabilization layer 3 is formed preferably from a metal, for example from nickel or copper. In particular, the stabilization layer is formed in such a way that it has a sufficient layer thickness, for example of at least 5 µm or at least 10 µm. In contrast to FIG. 1A, in a plan view, it is also possible for the stabilization layer 3 and the separating trenches 60 to be free of overlaps (see FIG. 3A).

A third insulation layer 93 is applied onto the stabilization layer 3, for example, by vapor deposition. The third insulation layer 93 can be of the same material as the first insulation layer 91 and/or the second insulation layer 92. In particular, the third insulation layer 93 is applied onto the semiconductor body composite 20 in a widespread manner such that, in a plan view, the third insulation layer 93 covers the semiconductor body composite 20 for instance completely. For exposing electrically conductive layers, the insulation layers 91, 92 and/or 93 are removed at least partially in the regions of the openings 31 and 32 of the stabilization layer 3, for example, by an etching method. In order to partially expose the mirror layer 80, the second insulation layer 92 and the third insulation layer 93 are removed in places in the region of the first opening 31. For exposing the current spreading layer 82, the passivation layer 90, the first insulation layer 91, the second insulation layer 92 and the third insulation layer 93 are removed in places in the region of the second opening 32. If the current spreading layer 82 is not present, in the region of the second opening 32, the protective layer 83 or the connection layer 84 is exposed in places.

Through-contacts 41 and 42 are formed. The through-contacts 41 and 42 are preferably formed by a galvanic coating method.

A first through-contact 41 is formed in particular in such a way that, in a plan view, it completely covers the first opening 31 and extends through the first opening 31 for electrically contacting the mirror layer 80. A second through-contact 42 is formed in such a way that, in a plan view, it completely covers the second opening 32 and extends through the second opening 32 for electrically contacting the current spreading layer 82. Via the mirror layer 80 and the through-via 81, the first through-contact 41 is electrically conductively connected to the first semiconductor layer 21. The second through-contact is electrically conductively connected to the second semiconductor layer 22 via the current spreading layer 82, the protective layer 83 and the connection layer 84.

The through-contacts 41 and 42 are thus assigned to different electrical polarities of the component to be produced. In the lateral direction, the first through-contact 41 is laterally spaced apart from the second through-contact 42 by an intermediate region 40. In particular, the through-contacts 41 and 42 are formed in such a way that the intermediate region 40 located between them is at least bridged, in particular is completely covered by the stabilization layer 3. The through-contacts 41 and 42 can be made of a metal, for example of nickel and/or copper. The through-contacts 41 and 42 can each have a vertical layer thickness which, for example, is at least twice, at least three times or at least five times as large as the layer thickness of the stabilization layer 3. For example, the through-contacts 41 and 42 each have a vertical layer thickness of between 3 µm and 200 µm inclusive, for instance between 50 µm and 150 µm or between 80 µm and 120 µm inclusive.

According to a method step, a mold body 5 or a mold body composite is formed on the semiconductor body composite 20. In this case, the mold body material can be applied to the semiconductor body composite 20 for instance by a casting method, such that the separating trenches 60 and/or the intermediate regions 40 are partially or completely filled by the mold body material. Here, the through-contacts 41 and 42 can be regionally or completely embedded in the mold body 5 or in the mold body composite. For exposing the through-contacts 41 and 42, the mold body 5 or the mold body composite 5 can be subsequently removed in regions.

In a subsequent method step, the composite 200 comprising the semiconductor body composite 200 and the mold body composite 5 is singulated into a plurality of components 100 for instance along the separating trenches 60 in such a way that the components 100 each comprise a semiconductor body 2, a stabilization layer 3 and a carrier 1. In particular, the carrier 1 has a first through-contact 41, a second through-contact 42 and a mold body 5, wherein the mold body 5 comprises one part of the mold body composite. In other words, the mold body 5 is part of the mold body composite and arises from the mold body composite during singulation of the composite 200. Such a component 100 is schematically illustrated in FIG. 1B, for example.

The component 100 is, in particular, free of a growth substrate. Prior to singulation, the growth substrate 10 can be removed from the semiconductor body composite 20 for example by a mechanical method such as grinding, a chemical method such as etching or by a laser lifting method.

Figure 1B:
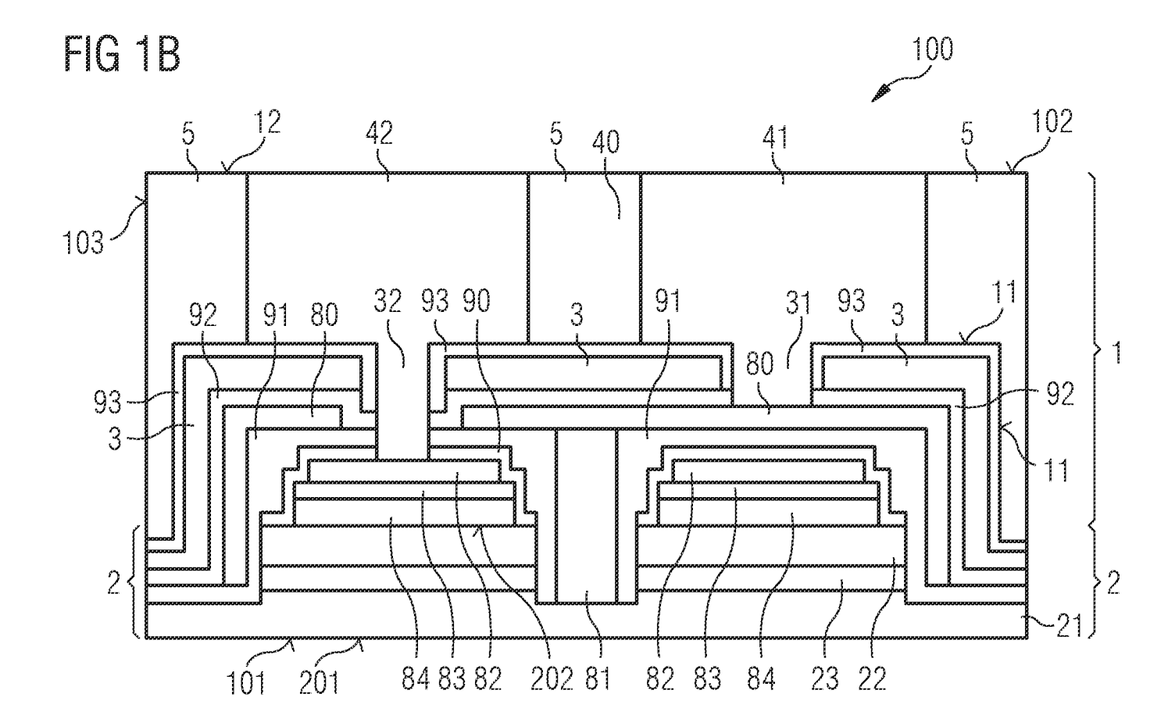

The component 100 illustrated in FIG. 1B comprises a semiconductor body 2 on a carrier 1. The component 100 has a radiation passage area 101. The radiation passage area 101 can be formed by the first main surface 201. It is also possible for the radiation passage area 101 to be formed by a surface of a protective layer or of a converter layer arranged on the semiconductor body 2. The component 100 has a rear side 102, which is formed for instance at least in regions by a rear side 12 of the carrier 1. The component 100 is in particular electrically connectable at the rear side 12 of the carrier 1 or at the rear side 102 of the component.

The component 100 has a side surface 103 which is formed at least in regions by surfaces of the mold body 5. In particular, the side surface 103 can comprise characteristic singulation traces. The carrier 1 has a front side 11. In particular, the front side 11 is formed in regions by surfaces of the mold body 5 and in regions by surfaces of the through-contacts 41 and 42. The through-contacts 41 and 42 can thus be electrically connectable both at the front side 11 of the carrier 1 and at the rear side 12 of the carrier 1. Thus, along the vertical direction, the through-contacts 41 and 42 extend throughout the mold body 5.

In the vertical direction, the stabilization layer 3, an insulating structure and a wiring structure are arranged between the semiconductor body 2 and the carrier 1. The insulating structure contains, for instance, only electrically insulation layers such as the passivation layer 90, the first insulation layer 91, the second insulation layer 92 and the third insulation layer 93. The wiring structure includes, for instance, only electrically conductive layers configured for electrically contacting the semiconductor body 2. In this case, the wiring structure contains in particular the mirror layer 80, the through-via 81, the current spreading layer 82, the protective layer 83, the connection layer 84 and, if applicable, the seed layers. The carrier 1 and the wiring structure as well as the insulating structure are applied to the semiconductor body 2 step by step prior to singulation of the wafer composite 200. Thus, the carrier 1, the wiring structure and the insulating structure are not formed separately from the semiconductor body 2 but are formed directly on the semiconductor body 2, i.e., in the presence of the semiconductor body 2.

Figure 2A:
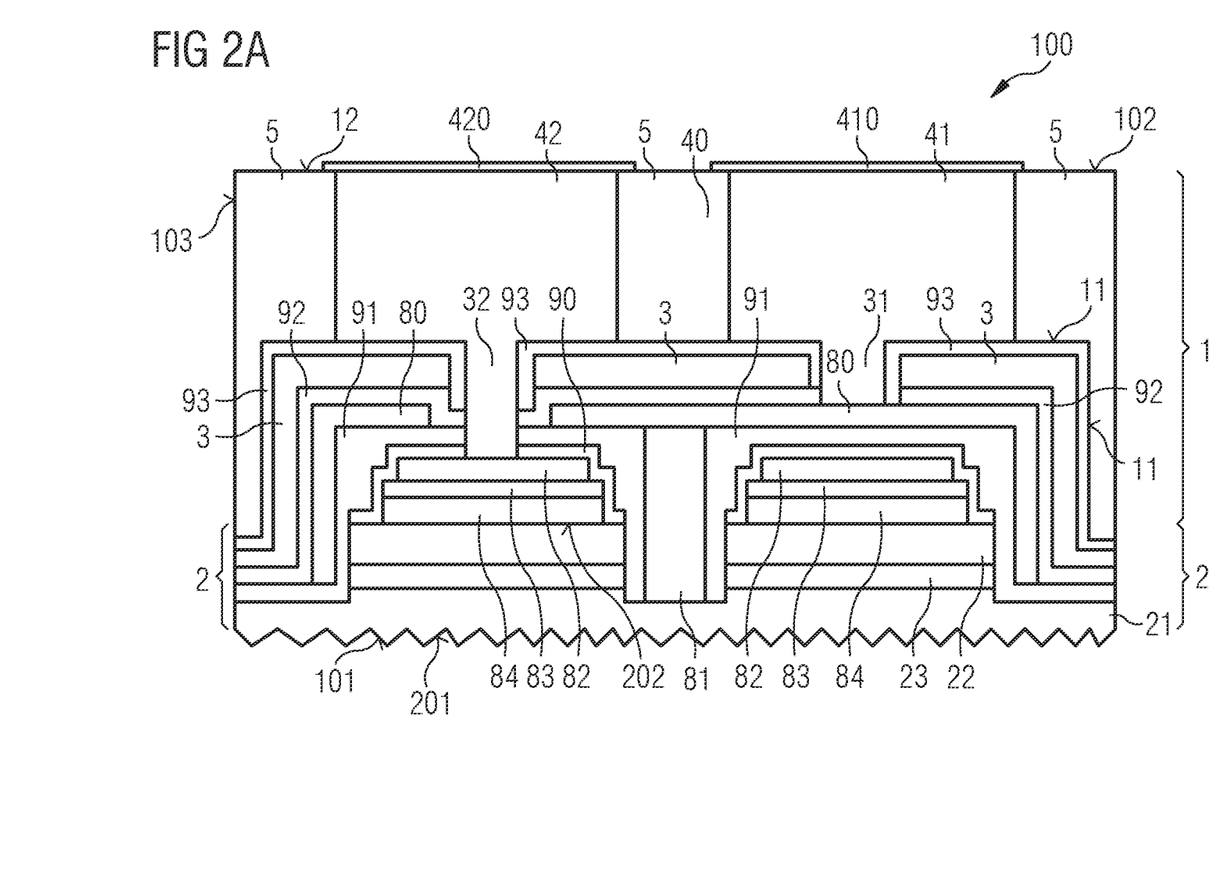
FIGS. 2A and 2B show different embodiments for a component in schematic sectional views.

The exemplary embodiment illustrated in FIG. 2A for a component 100 substantially corresponds to the exemplary embodiment illustrated in FIG. 1B. In contrast to this, the radiation passage area 101 is structured. Furthermore, the component 100 comprises contact layers 410 and 420 on the rear side 102. The first through-contact 41 is completely covered by a first contact layer 410. The second through-contact 42 is completely covered by a second contact layer 420. The component 100 can be externally electrically connected via the contact layers 410 and 420.

Figure 2B:
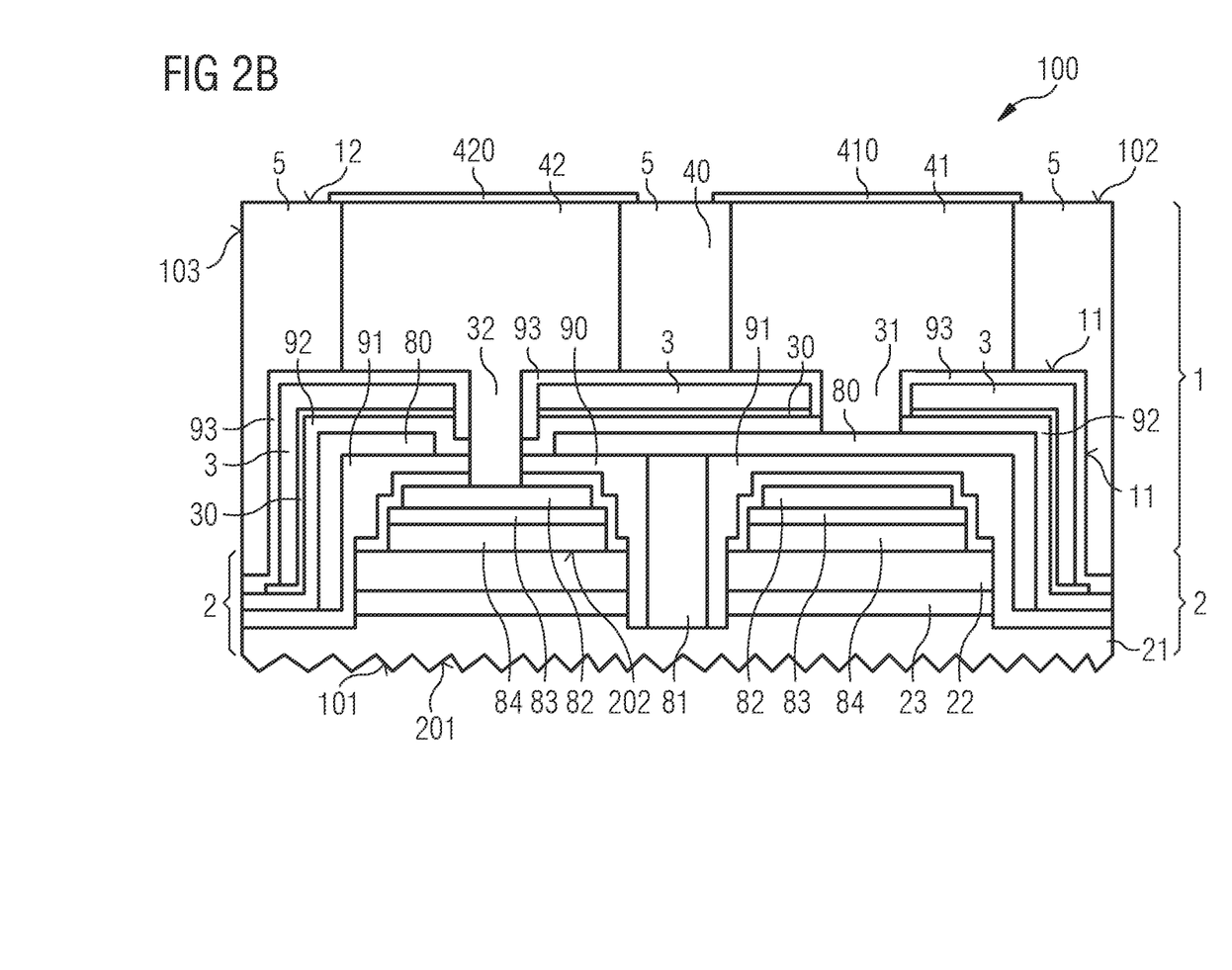

The exemplary embodiment illustrated in FIG. 2B for a component 100 substantially corresponds to the exemplary embodiment illustrated in FIG. 2A. In FIG. 2A, the stabilization layer 3 is freely accessible on at least one side surface 103 of the component. According to FIG. 2A, the stabilization layer 3 can have singulation traces on the side surface 103. In contrast thereto, according to FIG. 2B along the lateral direction, the stabilization layer 3 does not extend for instance as far as the side surface 103 of the component 100. In particular, the stabilization layer 3 is fully enclosed by the second insulation layer 92 and the third insulation layer 93. Furthermore, in FIG. 2B, the seed layer 30 is illustrated. The seed layer 30 is formed in a structured manner. The stabilization layer 3 comprising the openings 31 and 32 can be applied onto the structured seed layer 30 by a galvanic coating method. In FIG. 2B, the structured seed layer 30 does not extend as far as the side surface 103 of the component 100.

Figure 3A:
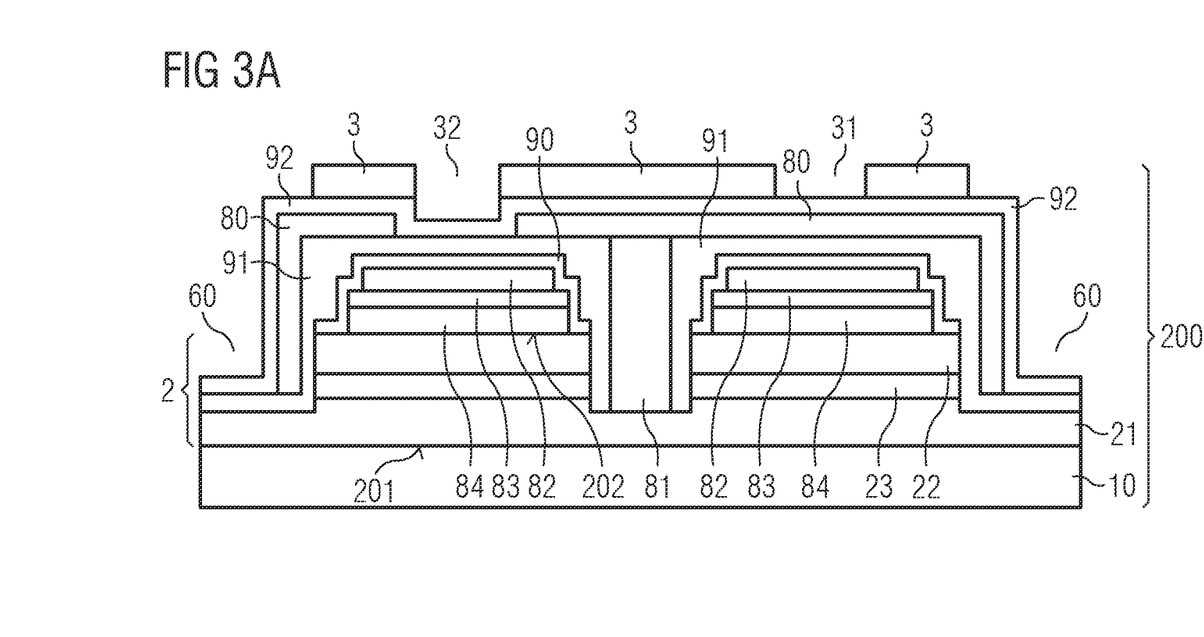
FIG. 3A shows a method stage of an exemplary embodiment for a method for producing one or a plurality of components in a schematic sectional view.
Figure 3B:
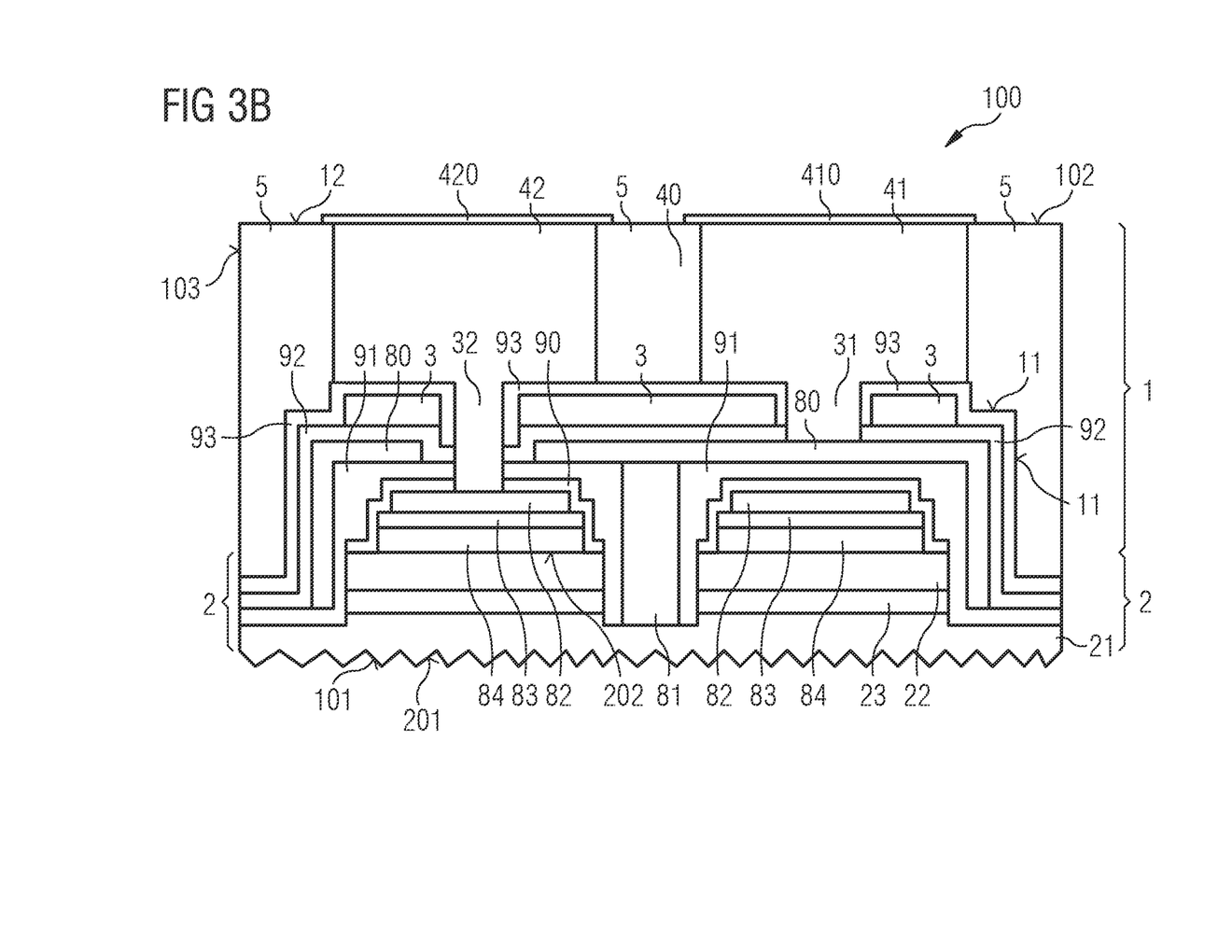
FIG. 3B shows a further exemplary embodiment for a component in a schematic sectional view which can be produced according to the exemplary embodiment illustrated in FIG. 3A for a method for producing one or a plurality of components.

The exemplary embodiment illustrated in FIG. 3A for a method stage of a method for producing a component substantially corresponds to the exemplary embodiment illustrated in FIG. 1A. In contrast to this, the stabilization layer 3 is formed in such a way that, in a plan view, the stabilization layer 3 and separating trenches 60 are free of overlaps. A component 100 produced according to this exemplary embodiment is shown for instance in FIG. 3B. Apart from that, the exemplary embodiment illustrated in FIG. 3B for a component 100 substantially corresponds to the component as illustrated in FIG. 2B.

By arranging a contiguous stabilization layer between a carrier and a semiconductor body of a component, the component can be formed to be particularly mechanically stable. If the stabilization layer is electrically isolated from the carrier and from the semiconductor body, the risk of possible short circuits, for instance due to a connecting material creeping up on side surfaces of the component, is reduced or largely avoided.

The present patent application claims the priority of German patent application DE 10 2015 117 198.8, the disclosure content of which is hereby included by reference.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the patent claims or exemplary embodiments.

The invention claimed is:
1. A component comprising:
    a carrier comprising a first through-contact and a second through-contact laterally spaced apart from the first through-contact by an intermediate region;
    a semiconductor body having a first semiconductor layer facing away from the carrier, a second semiconductor layer facing towards the carrier and an active layer arranged between the first semiconductor layer and the second semiconductor layer, wherein the first semiconductor layer is electrically conductively connected to the first through-contact and the second semiconductor layer is electrically conductively connected to the second through-contact; and
    a stabilization layer arranged in a vertical direction between the semiconductor body and the carrier, wherein the stabilization layer is formed in a contiguous manner, wherein the stabilization layer in a plan view has overlaps with the first and second through-contacts and laterally bridges the intermediate region, and wherein the stabilization layer is electrically isolated from the first and second through-contacts and from the semiconductor body.

2. The component according to claim 1, wherein the stabilization layer comprises a metal layer.

3. The component according to claim 1, wherein the stabilization layer has a layer thickness of between 5 µm and 50 µm, inclusive.

4. The component according to claim 1, wherein the stabilization layer has a first opening and a second opening, wherein the first through-contact extends through the first opening for electrically contacting the semiconductor body, and wherein the second through-contact extends through the second opening for electrically contacting the semiconductor body.

5. The component according to claim 1, wherein the stabilization layer and the first and second through-contacts together cover at least 90% of a total area of the active layer.

6. The component according to claim 5, wherein the stabilization layer and the first and second through-contacts together completely cover the active layer.

7. The component according to claim 1, wherein the carrier comprises a mold body of an electrically insulating material.

8. The component according to claim 6, wherein the first and second through-contacts are embedded in regions in the mold body and extend through the mold body along the vertical direction.

9. The component according to claim 8, wherein in lateral directions, the mold body of the carrier encloses the semiconductor body in regions.

10. The component according to claim 1, further comprising a through-via that extends through the second semiconductor layer and the active layer for electrically contacting the first semiconductor layer, wherein the through-via is electrically conductively connected to the first through-contact or the second through-contact.

11. The component according to claim 1, further comprising a mirror layer that is electrically conductively connected to the first through-contact or the second through-contact, wherein the mirror layer is arranged in the vertical direction between the carrier and the semiconductor body and is formed in such a way that it is covered on all side surfaces of the component.

12. The component according to claim 1, wherein the stabilization layer is freely accessible on at least one side surface of the component.

13. The component according to claim 1, further comprising an insulating structure that completely encloses the stabilization layer.

14. The component according to claim 1, wherein the stabilization layer is a self-supporting layer of the component and has a vertical layer thickness between 5 µm and 50 µm.

15. The component according to claim 1, wherein the stabilization layer is formed from an electrically conductive material.

16. The component according to claim 1, wherein the stabilization layer is a metal layer which completely enclosed by an insulating structure of the component.

17. A method for producing a component comprising a semiconductor body, a carrier and a stabilization layer arranged between the semiconductor body and the carrier in a vertical direction, wherein
providing a semiconductor body having a first semiconductor layer, a second semiconductor layer and an active layer arranged between the first semiconductor layer and the second semiconductor layer;
forming a carrier on the semiconductor body such that first semiconductor layer faces away from the carrier and the second semiconductor layer faces toward the carrier, the carrier comprising a first through-contact and a second through-contact laterally spaced apart from the first through-contact by an intermediate region, wherein the first through-contact is electrically conductively connected to the first semiconductor layer and the second through-contact is electrically conductively connected to the second semiconductor layer; and
forming a stabilization layer in a contiguous manner, the stabilization layer in a plan view overlaps with the first and second through-contacts and laterally bridges the intermediate region, wherein the stabilization layer is electrically isolated from the first and second through-contacts and from the semiconductor body.

18. The method according to claim 17, wherein the first and second through-contacts are applied on the semiconductor body by a galvanic coating method.

19. The method according to claim 17, wherein the stabilization layer is applied on the semiconductor body by a galvanic coating method.

20. The method according to claim 17, wherein the method produces a plurality of components;
wherein providing the semiconductor body comprises providing a wafer composite having a semiconductor body composite, a plurality of first through-contacts, a plurality of second through-contacts and a contiguous stabilization layer;
wherein the wafer composite comprises a plurality of separating trenches, through which the semiconductor body composite is severable into a plurality of semiconductor bodies;
wherein the method further comprises forming a mold body composite by applying a mold body material to the wafer composite in such a way that the separating trenches and intermediate regions between the first and second through-contacts are filled at least partially; and
wherein the method further comprises singulating the wafer composite and the mold body composite along the separating trenches into a plurality of components in such a manner that the components each have one of the semiconductor bodies, a stabilization layer and a carrier, wherein for each component the carrier has a first through-contact, a second through-contact and a mold body.

* * * * *

UNITED STATES PATENT AND TRADEMARK OFFICE
CERTIFICATE OF CORRECTION

PATENT NO. : 10,236,419 B2
APPLICATION NO. : 15/758186
DATED : March 19, 2019
INVENTOR(S) : Lutz Hoeppel et al.

Page 1 of 1

It is certified that error appears in the above-identified patent and that said Letters Patent is hereby corrected as shown below:

On the Title Page

Item (54) and in the Specification, Column 1, Line 1, delete "METOD" and insert --METHOD--.

In the Claims

In Column 12, Line 61, Claim 8, delete "claim 6" and insert --claim 7--.

Signed and Sealed this
Twenty-fifth Day of June, 2019

Andrei Iancu
*Director of the United States Patent and Trademark Office*